US012575357B2

(12) United States Patent
Kirkpatrick et al.

(10) Patent No.: US 12,575,357 B2
(45) Date of Patent: Mar. 10, 2026

(54) INTEGRATED WET CLEAN FOR GATE STACK DEVELOPMENT

(71) Applicant: Applied Materials, Inc., Santa Clara, CA (US)

(72) Inventors: Brian K. Kirkpatrick, Allen, TX (US); Steven C. H. Hung, Sunnyvale, CA (US); Malcolm J. Bevan, Sachse, TX (US)

(73) Assignee: Applied Materials, Inc., Santa Clara, CA (US)

( * ) Notice: Subject to any disclaimer, the term of this patent is extended or adjusted under 35 U.S.C. 154(b) by 723 days.

(21) Appl. No.: 17/859,777

(22) Filed: Jul. 7, 2022

(65) Prior Publication Data

US 2023/0010499 A1    Jan. 12, 2023

Related U.S. Application Data

(60) Provisional application No. 63/219,221, filed on Jul. 7, 2021.

(51) Int. Cl.
*H01L 21/687* (2006.01)
*H01L 21/02* (2006.01)
(Continued)

(52) U.S. Cl.
CPC .................. *H01L 21/02057* (2013.01); *H01L 21/28185* (2013.01); *H01L 21/67196* (2013.01);
(Continued)

(58) Field of Classification Search
None
See application file for complete search history.

(56) References Cited

U.S. PATENT DOCUMENTS 6,221,204 B1 * 4/2001 Liu ..................... H01L 21/6719
                                                    156/345.23
2003/0045131 A1 * 3/2003 Verbeke ........... H01L 21/67167
                                                    438/795
(Continued)

FOREIGN PATENT DOCUMENTS

JP          10261687 A      9/1998
JP          10321575 A     12/1998
(Continued)

OTHER PUBLICATIONS

Application No. JP022-107576 , Office Action, Mailed On Aug. 22, 2023, 6 pages.
(Continued)

*Primary Examiner* — Karla A Moore
(74) *Attorney, Agent, or Firm* — Kilpatrick Townsend & Stockton LLP

(57) ABSTRACT

Exemplary integrated cluster tools may include a factory interface including a first transfer robot. The tools may include a wet clean system coupled with the factory interface at a first side of the wet clean system. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a thermal treatment chamber coupled with the first transfer chamber. The tools may include a second transfer chamber coupled with the first transfer chamber. The second transfer chamber may include a third transfer robot. The tools may include a metal deposition chamber coupled with the second transfer chamber.

23 Claims, 3 Drawing Sheets

(51) Int. Cl.
  *H01L 21/28*          (2006.01)
  *H01L 21/67*          (2006.01)
(52) U.S. Cl.
  CPC .................. *H01L 21/67201* (2013.01); *H01L 21/67207* (2013.01); *H01L 21/68707* (2013.01)

(56) References Cited

U.S. PATENT DOCUMENTS

| | | | |
|---|---|---|---|
| 2003/0094137 A1* | 5/2003 | Matsui .............. | H01L 21/67748 427/377 |
| 2003/0194877 A1 | 10/2003 | Yau et al. | |
| 2004/0007257 A1* | 1/2004 | Park ......................... | B08B 3/12 134/133 |
| 2006/0042651 A1* | 3/2006 | Verhaverbeke ... | H01L 21/02074 134/28 |
| 2007/0128356 A1* | 6/2007 | Matsuyama ...... | H01L 21/67161 427/331 |
| 2007/0202254 A1 | 8/2007 | Ganguli et al. | |
| 2011/0051322 A1* | 3/2011 | Pushparaj .............. | H01G 11/36 257/E21.011 |
| 2015/0255270 A1 | 9/2015 | Ku et al. | |

| | | | |
|---|---|---|---|
| 2018/0211833 A1* | 7/2018 | Li ....................... | H01L 21/0228 |
| 2019/0319094 A1 | 10/2019 | Cheng et al. | |
| 2021/0175086 A1 | 6/2021 | Abhinand et al. | |
| 2023/0008695 A1* | 1/2023 | Kirkpatrick ....... | H01L 21/67184 |
| 2023/0021398 A1* | 1/2023 | Kirkpatrick ....... | H01L 21/67184 |

FOREIGN PATENT DOCUMENTS

| | | | |
|---|---|---|---|
| JP | 2009529789 A | 8/2009 | |
| JP | 2009533877 A | 9/2009 | |
| JP | 2009543355 A | 12/2009 | |
| JP | 2012517616 A | 8/2012 | |
| JP | 2013517616 A | 5/2013 | |
| JP | 2019061996 A | 4/2019 | |
| WO | WO-2012165861 A2 * | 12/2012 | ....... H01L 21/02057 |

OTHER PUBLICATIONS

Application No. JP2022-107576 , Notice of Decision to Grant, Mailed On Apr. 2, 2024, 3 pages.
Application No. TW111125272 , Notice of Decision to Grant, Mailed On Feb. 22, 2024, 4 pages.
Application No. TW111125272 , Office Action, Mailed On Jul. 19, 2023, 7 pages.

* cited by examiner

300

Receive substrate at factory interface          305

Deliver to wet clean system          310

Process substrate          315

Deliver to vacuum system          320

Process substrate          325

INTEGRATED WET CLEAN FOR GATE STACK DEVELOPMENT

CROSS-REFERENCE TO RELATED APPLICATIONS

This application claims the benefit of U.S. Provisional Application 63/219,221, filed Jul. 7, 2021, which is incorporated here by reference.

TECHNICAL FIELD

The present technology relates to semiconductor processing equipment and materials. More specifically, the present technology relates to cluster tool configurations and methods performed on cluster tools.

BACKGROUND

Logic gate performance is related to the characteristics of the materials used as well as the thickness and area of the structural layers. However, as some gate characteristics are adjusted to accommodate device scaling, challenges arise. For example, with a silicon oxide gate dielectric, capacitance may improve as thickness is reduced, which may lead to higher channel mobility and faster device performance. However, as the thickness continues to reduce, gate leakage may impact the device, and may cause reductions in device yield. Additionally, oxides with reduced thickness may be lower quality and cause shorting, and maintaining uniform thickness across the oxide becomes more important, as well as a greater challenge. High-k materials have been adopted for the gate dielectric to reduce the effective oxide thickness while limiting impact to the gate leakage. Efforts to maximize particular high-k materials have been limited due to morphology issues related to the formation of the high-k materials.

Thus, there is a need for improved systems and methods that can be used to produce high quality devices and structures. These and other needs are addressed by the present technology.

SUMMARY

Exemplary integrated cluster tools may include a factory interface including a first transfer robot. The tools may include a wet clean system coupled with the factory interface at a first side of the wet clean system. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a thermal treatment chamber coupled with the first transfer chamber. The tools may include a second transfer chamber coupled with the first transfer chamber. The second transfer chamber may include a third transfer robot. The tools may include a metal deposition chamber coupled with the second transfer chamber.

In some embodiments, the tools may include a dry etch chamber accessible to the first transfer chamber or the second transfer chamber. The wet clean system may include a single-wafer wet clean chamber operably maintained at atmospheric pressure. The first transfer chamber may be maintained at vacuum conditions. The single-wafer wet clean chamber may be fluidly coupled with multiple chemistry delivery systems. The single-wafer wet clean chamber may be accessible to the first transfer robot of the factory interface. The wet clean system may include a fourth transfer robot disposed in the wet clean system, the fourth transfer robot may be operable to transfer substrates between the single-wafer wet clean chamber and the load lock chamber. The wet clean system may include a plurality of single-wafer wet clean chambers stacked on one another. Each single-wafer wet clean chamber may be fluidly coupled with multiple chemistry delivery systems. A track on which the first transfer robot operates may extend into the wet clean system.

Some embodiments of the present technology may encompass integrated cluster tool. The tools may include a factory interface including a first transfer robot. The factory interface may include one or more access locations for front-opening unified pods on a first surface of the factory interface. The tools may include a wet clean system coupled at a first side of the wet clean system with a second surface of the factory interface opposite the first surface of the factory interface. The tools may include a load lock chamber coupled with the wet clean system at a second side of the wet clean system opposite the first side of the wet clean system. The tools may include a transfer chamber coupled with the load lock chamber. The transfer chamber may include a second transfer robot. The tools may include a metal deposition chamber coupled with the transfer chamber.

In some embodiments, the transfer chamber may be a second transfer chamber. The integrated cluster tool may include a first transfer chamber coupled between the load lock chamber and the second transfer chamber. The tools may include a dry etch chamber coupled with the first transfer chamber. The wet clean system may include a single-wafer wet clean chamber operably maintained at atmospheric pressure. The transfer chamber may be maintained at vacuum conditions. The single-wafer wet clean chamber may be accessible to the first transfer robot of the factory interface. The wet clean system may include a fourth transfer robot disposed in the wet clean system. The fourth transfer robot may be operable to transfer substrates between the single-wafer wet clean chamber and the load lock chamber. The wet clean system may include two or more vertically stacked, single-wafer wet clean chambers. Each single-wafer wet clean chamber may be fluidly coupled with a different chemistry delivery system.

Some embodiments of the present technology may encompass methods of processing a substrate. The methods may include receiving the substrate in a factory interface of an integrated cluster tool. The methods may include delivering the substrate from the factory interface to a wet clean system coupled with the factory interface on a first surface of the wet clean system. The methods may include processing the substrate in a wet clean chamber of the wet clean system to remove oxide from a surface of a substrate contained in a semiconductor processing chamber. The substrate may include a silicon layer. The methods may include delivering the substrate from the wet clean system to a load lock chamber coupled with the wet clean system on a second surface of the wet clean system opposite the first surface of the wet clean system. The methods may include delivering the substrate from the load lock chamber to a metal deposition chamber. The methods may include forming a high-k dielectric material. The methods may include treating the high-k dielectric material with a nitrogen-containing precursor. The methods may include annealing the high-k dielectric material.

In some embodiments, the methods may include, prior to forming the high-k dielectric material, oxidizing at least a portion of the silicon layer. The methods may include, subsequent to oxidizing at least a portion of the silicon layer, performing a wet clean process with a solution of ammonium hydroxide and hydrogen peroxide. The methods may include, prior to treating the high-k dielectric material with a nitrogen-containing precursor, annealing the high-k dielectric material. Processing the substrate in the wet clean chamber may include cleaning the substrate with a first chemistry including hydrofluoric acid. Processing the substrate in the wet clean chamber may include cleaning the substrate with a second chemistry comprising ammonium hydroxide. Processing the substrate in the wet clean chamber may include cleaning the substrate with a third chemistry comprising hydrochloric acid. Processing the substrate in the wet clean chamber may include cleaning the substrate with a fourth chemistry comprising ozone-infused deionized water.

Such technology may provide numerous benefits over conventional systems and techniques. For example, the present technology may provide a smoother interface for gate stack development. Additionally, the present technology may produce dielectric layers characterized by a more uniform thickness, which can reduce variation in electrical parameters. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
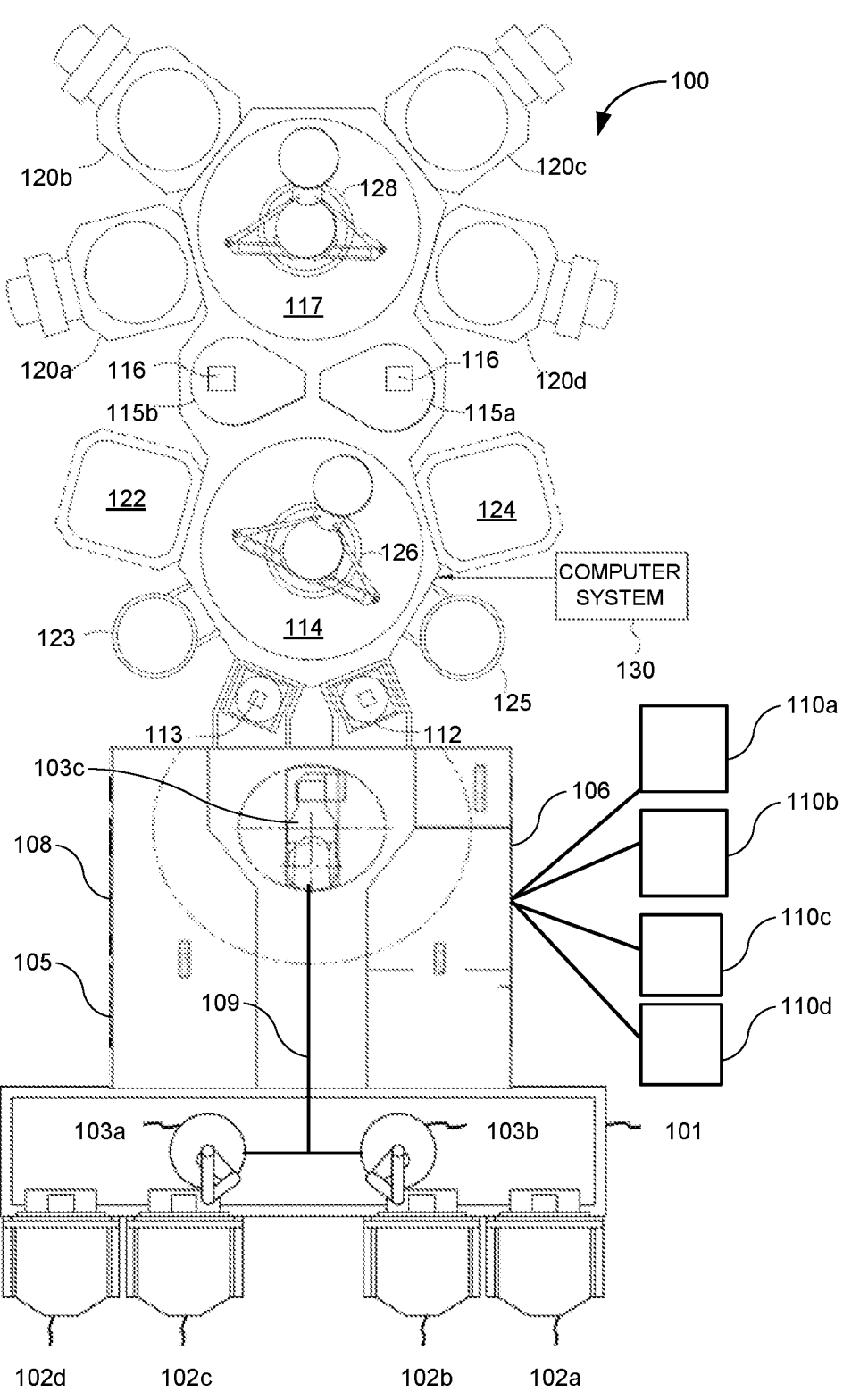
FIG. 1 shows a schematic top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As logic gate structures scale to smaller dimensions, new material structures are being sought to provide improvements. The use of high-k dielectrics increases the dielectric constant of the gate stack over conventional gate stacks that utilize materials such as silicon oxide. However, similar to silicon oxide, as material thicknesses are reduced, gate leakage increases. For example, gate leakage increases as the effective oxide thickness decreases. Hence, the inverse relationship between gate leakage and effective oxide thickness may form a limit on the performance of the transistor and the device produced.

For FinFET structures, the gate oxide overlying the fins may perform a number of functions. For example, the gate oxide may form the conductive channel region below the gate. Defects or holes within the gate oxide, such as from a lower quality oxide, may produce shorting and damage to the structure. Additionally, the gate oxide may block germanium diffusion in PFET or P-MOS regions of the device. Conventional techniques produce lower quality oxide layers, and may not be well controlled, which may over-oxidize into the fin. Because these ex situ chemical oxidation processes may be performed hours prior to subsequent processing, the oxidation may spread to increased depth during the delay in processing. This may produce less robust germanium oxide materials, which may be more likely to fail under thermal or electrical stresses. The present technology overcomes these issues by forming controlled gate oxide layers from defined silicon-containing materials. These gate oxide layers may limit over-oxidation of the SiGe fin material, and may provide improved electrical and thermal performance over conventional techniques. The present technology also provides mechanisms for incorporating dopants into channel regions and other substrate structures utilizing overlying layers.

The present technology may overcome these issues by utilizing a tool and process sequence that may limit exposure of wet-cleaned or oxidized substrates. By incorporating the wet clean system on a gate formation cluster tool, the delay between wet-cleaning and vacuum processing may be limited to minutes or seconds. This may produce a more uniform surface for material growth, as well as facilitate production of dielectrics having more uniform thickness. Despite conventional technologies seeking to reduce time delay, delays of hours are inevitable in conventional technologies based on batch processing in which multiple substrate are processed at each tool before being transferred to a subsequent tool. Consequently, ex situ chemical oxidation is incapable of producing structures of the present technology, and instead produces structures with increased oxidation due to time delay. Although the remaining disclosure will routinely identify specific materials and processes utilizing the disclosed technology, it will be readily understood that the systems and methods are equally applicable to a variety of materials and processes as may occur during deposition or other semiconductor processing. For example, the described technology may also be applied to FinFET and gate all-around structures. Accordingly, the technology should not be considered to be so limited as for use with the described gate formation alone. After discussing an exemplary chamber system that may be used according to some embodiments of the present technology, methods of semiconductor processing that may occur on the systems will be described.

FIG. 1 illustrates a schematic top plan view of an integrated cluster tool, or multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include components that may be maintained at atmospheric pressure, which may be any pressure within a processing facility, such as including positive or negative pressure environments. The system may also include components that are maintained under vacuum conditions, and which may be separated from the atmospheric components by a load lock system, for example.

Multi-chamber processing system 100 may include a factory interface 101, which may include receptacles along a first side of the unit to receive one or more front-opening unified pods, or FOUPs 102, for providing substrates to the system for processing. Although four FOUPs are illustrated as being coupled with the system, in some embodiments, one, two, three, four, or more FOUPs may be connected at any time. Each FOUP 102 may include one or more substrates for processing. Because FOUPs typically store several substrates for processing, conventional technologies often have large time delays between processing between tools. Each tool may process dozens of substrates as a batch, prior to transferring all substrates to the next tool. This may increase time delay, leading to the challenges described above.

Factory interface 101 may include one or more transfer robots 103, which may be operated to move laterally within the factory interface, and access any of the FOUPs. Opposite the side of the factory interface on which the FOUPs may be coupled may be a wet clean system 105, which may include one or more wet clean chambers 106. The wet clean system 105 may be coupled with the factory interface along a first end or surface of the wet clean system as shown, and may be accessible by one or more transfer robots 103. For example, in some embodiments, factory interface transfer robots 103a or 103b may be used to receive substrates from a FOUP connected to the factory interface, and may also be used to deliver substrates to the wet clean chamber 106. The factory interface transfer robots may also be used to deliver substrates to one or more load lock chambers 112, which may be coupled with the wet clean system 105 at a second end or surface of the wet clean system, such as the end opposite where the wet clean system is coupled with the factory interface 101.

In some embodiments, an additional transfer robot 103c may be included in the wet clean system, and may work with or in lieu of the factory interface transfer robots. For example, in some embodiments the factory interface transfer robot may deliver the substrate into the wet clean chamber 106, and the wet clean system transfer robot 103c may deliver the substrates from the wet clean chamber 106 to the load lock chambers 112. Additionally, the wet clean system transfer robot may receive substrates from the factory interface, and may deliver to and from the wet clean chamber 106. In some embodiments a track 109 on which the robots may be moved may extend through both the factory interface and the wet clean system to facilitate one or more robots being operable to receive and deliver substrates among the system components. Any of the noted transfer robots may move along any aspect of the track in some embodiments of the present technology.

Wet clean system 105 may include a number of components and chambers for processing substrates. For example, wet clean hardware 108 may be included in the system to facilitate operations as will be explained further below. Wet clean chamber 106 may be one or more chambers in embodiments of the present technology. For example, wet clean chamber 106 may include a batch cleaning bath or system, and may be or include one or more single-wafer wet clean chambers in some embodiments. Single-wafer wet clean chambers may be stacked in some embodiments, as will be explained below, which may allow individual processes to be performed in each chamber, or may allow multiple substrates to be processed simultaneously, for example. The chambers may be fluidly coupled with one or more chemistry delivery systems 110, which may include pumps, tubing, and other materials for delivering one or more process chemistries to the one or more wet clean chambers 106.

Any number of wet clean processes may be performed according to aspects of the present technology, and in some embodiments the wet cleaning may include multiple cleaning processes and chemistries. For example, in some embodiments a first chemistry delivery system 110a may provide a first chemistry including hydrofluoric acid. A second chemistry delivery system 110b may provide a second chemistry including ammonium hydroxide. A third chemistry delivery system 110c may provide a third chemistry including hydrochloric acid. A fourth chemistry delivery system 110d may provide a fourth chemistry including ozone dissolved in deionized water. It is to be understood that the chemistries may come from one or more fluid sources and be delivered to one or more wet clean chambers. Additionally, although shown separate from the wet clean system 105 for ease of explanation, it is to be understood that the fluid delivery systems may be included with the system, such as being part of the clean hardware section of the system, for example. Once cleaning operations have been performed, substrates may be delivered into load lock chambers 112, which may transfer the substrates to a vacuum environment for processing. By limiting delay between wet cleaning and further processing, in some embodiments baking operations may be limited or avoided.

As explained above, wet clean chamber 106 may be maintained at atmospheric pressure, or a common pressure with the facilities environment. Multi-chamber processing system 100 may also include a number of components at vacuum conditions. For example, load lock chambers 112 may be used to transfer substrates to and from a vacuum environment coupled on the opposite sides of the load lock chambers from the wet clean system. Although single-wafer load locks are illustrated, it is to be understood that dual-wafer or multi-wafer load locks may also be used in systems according to embodiments of the present technology. Once substrates are delivered to the load lock chambers, vacuum conditions may be enacted, as well as one or more other process operations. Because wet cleaning as will be described further below may initiate oxide formation, while limiting formation depth. Along with providing vacuum pressures, load lock chambers 112 may perform additional operations, such as purging and heating. For example, load lock chambers 112 may be purged with nitrogen, argon, or some other inert or non-reactive gas, which may limit contaminant incorporation or increased oxide formation on the surface of the substrate. Additionally, a heating operation may be performed, which may ensure moisture is removed or prevented from contacting the substrate.

Once the substrate is ready for further processing, or the substrate is received in the queue, further processing within the system may occur. The multi-chamber processing system 100 may include transfer chambers for providing the substrate to any number of locations on the system. For example, a first transfer chamber 114 may be coupled with the load lock chambers 112 as illustrated, and may receive a substrate for further processing. About the first transfer chamber may be any number of processing chambers, which may be used to perform any number of processes on the substrate. Although the remaining discussion will involve chambers involved in preparation for, or performance of, gate stack formation operations, it is to be understood that any number of other processing chambers may be included on the system. For example, chambers 123 and 125 may be used for pre-treatment or post-treatment operations as described below, metrology, orientation, or any number of other operations that may be performed in semiconductor processing. Substrates may also be delivered into processing chambers 122, 124, which may be configured to perform dry etch processes, anneals, oxidation, or other processing as further described below. Any number of etch processes may be performed, such as a process for removing native oxide, a process for epitaxially forming silicon, or silicon-containing materials, or any other number of processes that may be performed to process a substrate for gate formation.

Substrates may also be transferred to additional processing chambers 120, which may be used to perform one or more metal deposition operations, such as forming a high-k dielectric material, as will be described further below. A second transfer chamber 117 may be coupled with first transfer chamber 114, and may be used to deliver substrates to and from the epitaxial growth chambers in some embodiments. As will be explained in further detail below, each of the processing chambers 120a, 120b, 120c, and 120d may be configured similarly or differently, depending on the processing to be performed. For example, some specific processes that may be performed in any of the chambers or in any combination of chambers may be metal deposition, surface cleaning and preparation, thermal annealing such as rapid thermal processing, and plasma processing. Delivery between the first transfer chamber 114 and the second transfer chamber 117 may be facilitated with transfer robots within the chambers. Two substrate transfer platforms 115 may be disposed between transfer chamber 114 and transfer chamber 117, and may facilitate transfer between robots 126 and 128. The transfer platforms 115a and 115b may be open to the transfer chambers, which may also be buffer chambers, or the platforms may be selectively isolated or sealed from the chambers to allow different operational pressures to be maintained between the two transfer chambers, for example. Transfer platforms 115 may each include one or more tools 116, such as for orientation or measurement operations, in some embodiments of the present technology.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers and wet clean system may be configured to perform one or more process operations in the fabrication of a semiconductor structure. More specifically, the processing chambers may be outfitted to perform a number of additional substrate processing operations that may include dry etch processes, cyclical layer deposition, atomic layer deposition, epitaxial deposition, oxidation, nitridation, chemical vapor deposition, physical vapor deposition, etch, pre-clean, degas, orientation, among any number of other substrate processes.

Figure 2:
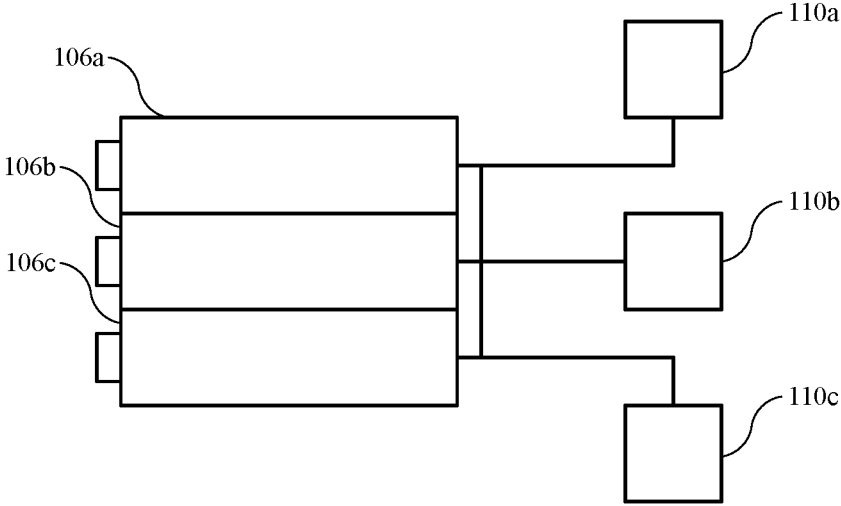
FIG. 2 shows a schematic cross-sectional view of stacked wet clean chambers according to some embodiments of the present technology.

As explained previously, wet clean chamber 106 may include multiple single-wafer wet clean chambers in some embodiments of the present technology. FIG. 2 shows a schematic cross-sectional view of stacked wet clean chambers according to some embodiments of the present technology. As illustrated, two or more wet clean chambers 106 may be stacked vertically, which may limit the length of the integrated cluster tool in some embodiments of the present technology. The chambers may be stacked on one another, and may be accessible to any of the transfer robots. Additionally, because wet clean chambers may be accessed at an angle, as opposed to only by straight-on delivery, the chambers may readily be accessed by the different transfer robots as previously described, without requiring additional modification of the transfer robots.

As explained previously, processing according to some embodiments of the present technology may include performing multiple wet clean operations, which may facilitate removal of residual dielectric materials, and may provide an initial interfacial oxidation, that may improve film development. In some embodiments, different wet clean chambers may be utilized to perform different cleaning operations, although in embodiments each wet clean chamber may be fluidly coupled with a number of chemistries for performing all cleaning and preparation options discussed below. For example, wet clean chamber 106a, may be coupled with chemistry delivery system 110a, which may include chemistry for performing a first wet clean, wet clean chamber 106b, may be coupled with chemistry delivery system 110b, which may include chemistry for performing a second wet clean, and wet clean chamber 106c, may be coupled with chemistry delivery system 110c, which may include chemistry for performing a third wet clean. Any number of additional wet clean chambers may also be included, which may allow a fourth treatment, such as oxidation, to be performed. Additionally, as illustrated, each wet clean chamber 106 may be fluidly coupled with each of the chemistry delivery systems 110, which may allow each wet clean chamber to perform a number of cleaning and preparation operations as will be described below. Although three stacked wet clean chambers 106 are illustrated, it is to be understood that in embodiments of the present technology wet clean systems may include a single wet clean chamber, or may include stacked or otherwise oriented clean chambers, including two or more, such as three, four, five, or more wet clean chambers according to embodiments of the present technology.

Figure 3:
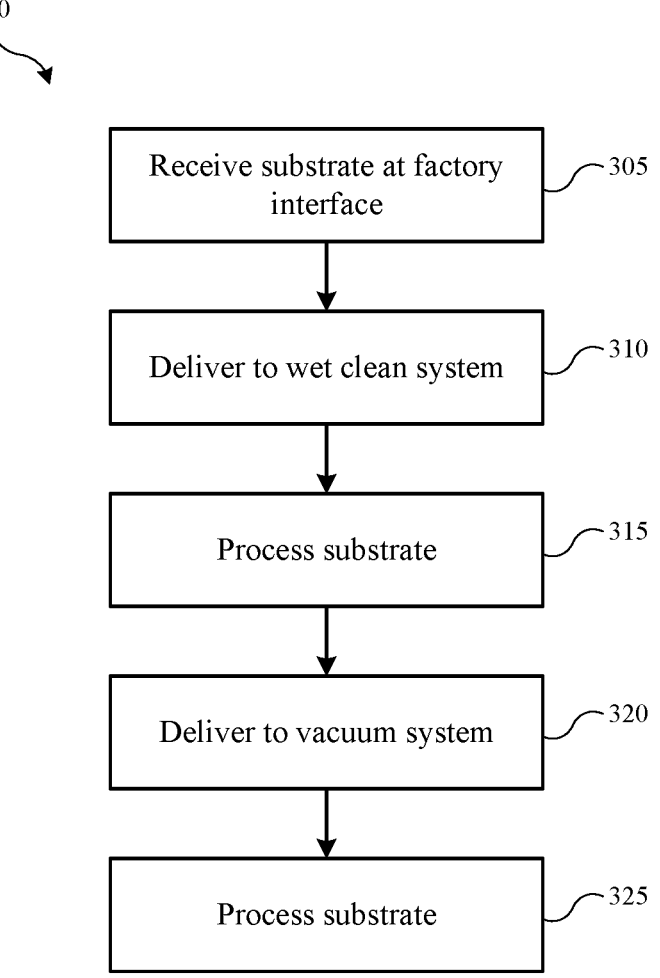
FIG. 3 shows selected operations in a method of processing a substrate according to some embodiments of the present technology.

Turning to FIG. 3 is illustrated selected operations in a method 300 of processing a substrate according to some embodiments of the present technology. Method 300 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below.

Method 300 may involve receiving a substrate at a factory interface of an integrated cluster tool at operation 305, such as integrated multi-chamber processing system 100 described above. The substrate may be removed from a FOUP by a transfer robot into the tool environment. At operation 310, the substrate may be delivered from the factory interface to a wet clean system, which may be maintained at a higher processing pressure, such as up to atmospheric pressure. Substrate processing may be performed at operation 315 with one or more wet clean chambers as will be described further below. Once the substrate cleaning operations have completed, the substrate may be delivered to a vacuum system at operation 320. For example, a transfer robot that may remove the substrate from the wet clean chamber may directly load the substrate into a load lock chamber connected with the wet clean system, as previously described. From the load lock chamber, the substrate may be further processed at operation 325, which may include a number of gate oxide formation operations.

By delivering the substrate directly to a load lock chamber, time between finishing the wet clean process and starting the gate stack formation process may be reduced from hours of delay in conventional systems, to less than or about 30 minutes, and depending on any intervening processing being performed, the time may be less than or about 20 minutes, less than or about 15 minutes, less than or about 10 minutes, less than or about 5 minutes, or less. Additionally, unlike hours of atmospheric exposure that may occur in conventional technologies, which may allow an increased oxidation depth to be formed, the time between finishing the wet clean operation and delivering the substrate to the load lock chamber may be less than or about 5 minutes, less than or about 3 minutes, less than or about 1 minute, less than or about 50 seconds, less than or about 40 seconds, less than or about 30 seconds, less than or about 20 seconds, less than or about 10 seconds, less than or about 5 seconds, or less. As previously explained, conventional technology with separate tooling for wet processing and gate oxide formation is incapable of producing such uniformity in wafer processing, as substrates wait hours to be transferred between the systems due to batch processing and tool queue times.

Substrates delivered to the cluster tool may include any number of materials including silicon, silicon germanium, or silicon-containing materials such as oxides, nitrides, and carbides of silicon, as well as any other materials that may be incorporated within a structure. In some embodiments encompassed by the present technology, the substrate may be a portion of a silicon nanosheet, such as which may be associated with a gate all-around structure, and may be part of the N-GAA region. Prior to method 300, layers of silicon and silicon germanium may be formed on a silicon substrate, or other substrate, and may be patterned to form a gate all-around structure. An isolation dielectric may be formed about the nanosheet, and a trim operation may be performed to thin the nanosheet. It is to be understood that alternative structures may also be provided, and on which operations of the present technology may be performed.

Subsequent this processing or as a result of transfer of the substrate, the delivered substrate may include a native oxide or residual particulate material on the surface of the silicon germanium. The exposed material at a surface of the substrate may be etched with a dry etch process, although as described above, by performing a wet clean process that occurs within the cluster tool, time delay that may otherwise lead to over-oxidation may be avoided. Additionally, wet cleaning operations may provide more uniform surface conditions, and may facilitate more thorough oxidation during a subsequent oxidation step, as will be described further below. Accordingly, in some embodiments, the substrate may be delivered to the cluster tool and provided to a wet clean chamber within a wet clean system to remove the native oxide, and/or prepare a surface for subsequent processing.

For example, in some embodiments of the present technology, the wet clean performed prior to the gate formation process may include a number of operations performed in one or more wet clean chambers. For example, a first clean process may include performing a hydrofluoric acid clean for a first period of time. The hydrofluoric acid etch, performed with dilute hydrofluoric acid, may remove residual dielectric materials that may remain on surfaces, and may remove residual native oxide, if present. A first rinse process may then be performed, such as using deionized water. Once the surface has been cleared of material, surface processing may be performed to increase uniformity and limit impurities across the substrate. A second clean process may include performing a clean with a solution of ammonium hydroxide and hydrogen peroxide for a second period of time. The solution may remove light organic materials and particles from the surface of the substrate, and may also remove surface-adsorbed halogen materials. A second rinse with deionized water may then be performed. A third clean process may include performing a clean with a solution of hydrochloric acid and hydrogen peroxide for a third period of time. The solution may remove residual metal materials from the surface on which epitaxial growth may be performed. A third rinse with deionized water may then be performed. In some embodiments, a fourth clean process may be performed, which may include performing a clean with an ozone-infused de-ionized water, or other oxidation agent. This may provide an initial oxidation at the interface, which may be formed into a more dense oxide coating in subsequent processing as described below.

The time period for any of the clean and/or rinse processes may be less than or about 60 seconds, and may be less than or about 50 seconds, less than or about 40 seconds, less than or about 30 seconds, less than or about 20 seconds, less than or about 10 seconds, or less. After the cleaning operations have been performed, one or more drying operations may be performed. For example, the substrate may be dried in a spin dry process. Additionally, the chamber may perform more involved drying operations. For example, the cleaned wafer to be dried may be horizontally rotated, and a moveable arm containing two fluid delivery nozzles may be brought to the center of the wafer. The leading nozzle may contain deionized water delivered across the wafer, and the trailing nozzle may contain alcohol, or an $N_2$/tensioactive vapor dispense, for example. The arm then may be moved from the center of the wafer to the edge of the spinning wafer, drying the wafer in a way to limit or prevent development of water marks. Additionally, in some embodiments, a surface modification drying operation may be performed, which may cause silylation reactions that dry the surface on which growth is to be performed. As explained above, different operations may be performed in any number of wet clean chambers. In some embodiments, each of the processes may be performed in a single-wafer wet clean chamber, including the drying operation.

From the load lock chamber, the processing may then deliver the substrate to one or more processing chambers prior to forming a high-k dielectric material as will be explained below. Once the substrate has been delivered to the load lock, the processing may include performing operations in one or more processing chambers without exposing the substrate surface to atmosphere or air, such as by maintaining a vacuum within system 100 while transferring a substrate between one or more chambers for operations of the method. Maintaining an integrated vacuum may advantageously reduce surface contamination, as well as unwanted additional oxide formation. The transferring may occur between one or more chambers on a single platform, although in some embodiments the transferring may occur between chambers on multiple platforms. However, by utilizing a single platform, the avoidance of substrate exposure to an oxygen environment may be better secured.

In some embodiments, a silicon-containing material may be formed or deposited on the pre-treated or cleaned substrate surface. For example, a layer of silicon, or a silicon-containing material such as doped silicon, alloyed silicon, or a silicon-and-metalloid or silicon-and-metal material, may be formed or deposited by any number of methods to form a layer overlying a surface of the substrate. In some non-limiting embodiments, silicon may be epitaxially grown conformally over a surface of the silicon germanium fin, although in some embodiments where the wet clean operation may be used to produce an amount of oxidation, the process may proceed to further oxidation operations, or high-k material deposition as described further below. Additionally, an atomic-layer deposition process may be performed to produce a silicon layer that is conformally deposited or formed on the substrate. The conformal formation may allow control over thickness over conventional deposition techniques. The layer may be formed to any height, and may produce a relatively high quality silicon. For example, the silicon layer may be formed to several angstrom or several nanometers in height in various embodiments. In some embodiments, the layer may be formed to a thickness of less than or about 10.0 nm, and may be formed to a thickness of less than or about 8.0 nm, less than or about 5.0 nm, less than or about 4.0 nm, less than or about 3.0 nm, less than or about 2.0 nm, less than or about 1.0 nm, less than or about 9 Å, less than or about 8 Å, or less.

In some embodiments the silicon layer may be formed as amorphous silicon, and may include a dopant material during the formation process. Dopant particles may be incorporated within the silicon layer during deposition. The dopant may be delivered as an additional precursor, which may further interact with one or more silicon-containing precursors or other deposition precursors or carrier gases to incorporate dopant particles within the silicon material being formed. Exemplary dopant materials may be nitrogen, phosphorous, fluorine, or any other material that can be incorporated within the silicon structure. The materials may be delivered in any number of forms, although the materials may be delivered in more readily dissociable forms to limit additional material incorporation within the silicon layer. For example, exemplary precursors may include diatomic nitrogen, nitrogen trifluoride, fluorine, hydrogen fluoride, phosphine, or any other nitrogen-containing, fluorine-containing, or phosphorous-containing material.

Subsequent formation of the silicon layer, a portion of the layer may be oxidized, or the oxidation may be performed directly upon delivery of the wet-cleaned substrate, which may include an amount of oxidation when the fourth clean process is performed. The oxidation may be performed in any number of ways, and the oxidation may fully oxidize the layer, although the oxidation may not extend fully through the silicon layer. Oxidation operations may produce a sacrificial oxide by converting a portion of the silicon layer into silicon oxide, when silicon is formed, up to the full layer of silicon. Oxidation operations may oxidize a portion of the silicon layer while at least partially maintaining a portion of the silicon layer in contact with the semiconductor substrate. For example, a controlled oxidation may be performed to limit an extension of the oxidation through the silicon-containing layer. Additionally, when the wet cleaning operations produce the oxidation, a subsequent oxidation may be performed to increase the density and uniformity of the oxidation previously produced. The oxidation may include a thermally-based reaction using steam, such as an in situ steam generation process, whereby oxidation takes place at a lower rate as compared with conventional thermal techniques. Additionally, the oxidation may utilize hydrogen and oxygen together as a thermal oxidation process, as well as additional precursors. For example, in some embodiments an oxygen-containing precursor may be used, such as a nitrogen-and-oxygen-containing precursor. For example, nitrous oxide, or some other nitrogen-and-oxygen-containing precursor, and/or additional precursors, such as hydrogen for example, may be used to oxidize the portion of the silicon-containing material.

The nitrogen may serve as a carrier for oxygen and may not become part of the interface or substrate. The process may also occur slowly, which may produce a more controlled oxidation, and which may be controlled to maintain a particular thickness of silicon along the surface of the substrate. Subsequent formation of a sacrificial oxide, a number of other fabrication operations may occur, including forming a dummy poly mask followed by dummy gate formation on the substrate. After processing has been performed, a gate oxide formation process may occur, as will be described further below.

The oxidation process may be used to facilitate additional operations as well. For example, by incorporating dopants into the silicon layer, the oxidation process may be used to thermally drive the dopants through the silicon layer and into the underlying substrate. For example, the temperature of the oxidation may allow the dopant materials to diffuse fully through the silicon layer and incorporate within the underlying materials. Incorporating fluorine, nitrogen, or phosphorous into the substrate, such as the underlying channel region that may reside underneath the gate to be formed, for example, may increase operational performance and reliability of the device formed. While doping may be performed during development of the underlying channel region, incorporating dopants subsequently with the oxidation operation may ensure high quality formation occurs through the channel region. Additionally, the formation may occur without incorporating excessive amounts of other constituents of the dopant materials, such as hydrogen, or other components of the dopants as delivered in precursor form.

One or more removal operations may be performed optionally to remove the sacrificial oxide overlying the maintained silicon. The maintained silicon may be characterized by a thickness sufficient to maintain coverage over the silicon germanium substrate material. For example, in some embodiments the silicon layer may be maintained at less than or about 5 nm, and may be maintained at less than or about 4 nm, less than or about 3 nm, less than or about 2 nm, less than or about 1 nm, less than or about 5 Å, or less. The removal operation may include a selective etch, such as an oxide-selective etch. In some embodiments, a plasma etch process may be performed, such as with a fluorine-containing precursor and a hydrogen-containing precursor. The removal operation may include any number of precursors, such as by utilizing a nitrogen trifluoride and ammonia plasma etch, which may also include an additional heat treatment or sublimation operation. Additional or alternative fluorine and hydrogen-containing precursors may also be used in some embodiments. In some embodiments, a plasma removal may not be performed for this removal, as plasma effluents may further damage underlying structures. Accordingly, in some embodiments, the substrate may be transferred back to the wet clean system, and a wet oxide removal utilizing dilute hydrofluoric acid may be used, which may control the etch process, and limit or prevent complications that may be produced due to plasma damage. The wet processing may also include any of the other treatments described elsewhere, including a treatment utilizing an ammonium hydroxide solution, a treatment utilizing a hydrochloric acid solution, and/or a treatment utilizing ozone-infused deionized water. By performing an oxide-selective etch process, the underlying portion of silicon may be maintained or substantially maintained.

After the silicon cap material has been exposed, a second oxidation operation may be performed to oxidize the remaining silicon layer of material overlying the silicon germanium fin. Any of the previous oxidation operations may be performed to produce an oxygen-containing material, such as silicon oxide. In some embodiments the remaining silicon material may be fully converted to silicon oxide, and no residual silicon layer may remain. In some embodiments, the oxidation may utilize nitrous oxide and hydrogen as explained above. This may tightly control the oxidation to be substantially limited to the silicon material, while limiting or preventing over oxidation into the silicon germanium material. Such a thermal oxidation process may provide many benefits as explained above. For example, unlike an ex situ wet oxidation, for example, the present oxidation may produce a high quality oxide, which may limit germanium diffusion.

Additionally, some conventional oxidation processes, including ex situ wet oxidation and dry oxidation processes, may over oxidize into the silicon germanium, as previously described, which may produce germanium oxide materials. Germanium oxide may be characterized by less stable bonding compared to silicon oxide, and consequently, subsequent operations may break the germanium oxide bonds. This may damage the oxide formed, or reduce the quality of the interface between the materials, which may limit the transistor efficiency, or damage the device. Forming a high-quality oxide may beneficially protect the structure during later operations as well. For example, conventional processes producing a less dense oxide may be further degraded with additional fabrication operations. As will be explained below, additional high-k dielectric operations may be performed as well as subsequent fabrication, which may include high temperature processes. For example, at some point in fabrication a flash anneal may be performed at up to 1000° C. For lower quality or less dense oxides, this may promote additional germanium diffusion due to a more porous oxide structure. The more dense thermal oxide processes according to some embodiments of the present technology may protect against diffusion during subsequent fabrication operations. By maintaining control of the oxidation according to embodiments of the present technology, high quality oxide materials with specific depth may be provided at any of the reduced thicknesses described above.

The oxygen-containing material formed may be high quality and highly ordered, meaning a crystallographic structure free of or substantially free of defects. This may provide an interface that may prevent additional materials from accessing closely to the channel region, thus preventing leakage. The resultant oxygen-containing material may include silicon dioxide. The oxygen-containing material formed may have a thickness of up to or about 5 Å, and may have a thickness of greater than or about 5 Å, greater than or about 10 Å, greater than or about 15 Å, greater than or about 20 Å, greater than or about 25 Å, greater than or about 30 Å, or greater.

The processing may include optionally delivering a pre-treatment precursor to the substrate. The pre-treatment precursor may be or include a nitrogen-containing precursor or an oxygen-containing precursor. The precursor may contact the substrate and may form or introduce reactive ligands on an exposed surface of the substrate. Unlike conventional technologies, the present technology may utilize a pre-treatment configured to produce an orderly growth of high-k dielectric material in subsequent operations.

The pre-treatment precursor may be or include any nitrogen-containing or oxygen-containing precursor. Oxygen-containing precursors may be characterized by a hydroxyl group [—OH], which may be incorporated on the surface of substrate oxygen-containing material. Nitrogen-containing precursors may be characterized by an amine group [—NH$_2$], or other nitrogen-containing group. For example, nitrogen-containing precursors may be or include nitrogen-and-hydrogen-containing precursors, such as ammonia as one non-limiting example, or nitrogen-and-oxygen-containing precursors, or any other precursor including nitrogen. Additionally, in some embodiments, the process may include transferring the substrate back to the wet clean system, where some or all of the clean process previously described may be performed in a second instance during processing, directly prior to high-k dielectric material formation. For example, in some embodiments, when provided back to the wet clean chamber, the process may include only a subset of the cleaning operations previously described. Although any number of the cleaning operations may be performed, an exemplary operation may include processing the substrate only with the solution of ammonium hydroxide and hydrogen peroxide, followed by a controlled drying operation, as previously described. In addition to removing any residual organics and particles from the surface of the oxide, this may maintain an amount of moisture on the surface on which subsequent deposition may be performed, and increase hydroxyl surface terminations to facilitate nucleation as noted below.

The surface terminations in some embodiments may be or include a hydroxyl group or an amine-group-terminated surface. Gate formation processing may then include forming a high-k dielectric material overlying the oxygen-containing material. The present technology may encompass any formation or deposition of the high-k material, although in some embodiments the formation may be or include an atomic layer deposition, which may utilize any number of atomic layer deposition chambers, such as which may be included on the cluster tool as described above, for metal or metal-containing film deposition. By performing wet processing directly prior to the gate formation process, an amount of moisture may be incorporated within the structure. This may be tuned based on the drying processes previously performed, and by maintaining an amount of moisture, remaining hydroxyl surface terminations may be included, which may facilitate high-k material nucleation, and which may improve quality and uniformity of growth. The high-k material formation may be performed directly after pre-treating the substrate or oxygen-containing material surface, if performed, and may be performed in the same chamber as the pre-treatment or in an additional chamber, such as an additional chamber incorporated on the same system, such as system 100. In some embodiments, vacuum conditions may be maintained while the substrate is transferred from the pre-treatment chamber to the deposition or formation chamber, which may limit exposure of the substrate to air.

Where an atomic layer deposition process is performed to form the high-k dielectric material, a metal-containing precursor may be delivered to the substrate to react with the pre-treated surface. For example, a transition-metal-containing precursor, a poor-metal-containing precursor, or a lanthanide-metal-containing precursor may be delivered to the processing chamber to interact with the reactive ligands exposed on the substrate from the pre-treatment. An oxygen-containing precursor may then be delivered in a second operation, such as subsequent a purge of the metal-containing precursor. This may produce an oxide layer by atomic layer deposition. In one non-limiting example, a hafnium-containing precursor may be delivered in a first operation and an oxidant may be delivered in a second operation for producing a hafnium oxide film. Additional metal-containing precursors may include zirconium-containing precursors for producing zirconium-containing materials, as well as any other number of metal-containing precursors for producing additional metal oxide structures. For hafnium-containing precursors, and similarly for any alternative metals, the precursors may be or include halogen-containing precursors, oxygen-containing precursors, hydrogen-containing precursors, or carbon-containing precursors in any of which hafnium is incorporated.

For the oxidant, any oxygen-containing precursor may be used that may react with the metal-containing materials. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal, such as hafnium, to produce a metal oxide material layer overlying the substrate. Again, any of the metal-containing materials noted above may be used in embodiments of the present technology, and may include any of the grouped metals, which may include, and may not be limited to, hafnium, zirconium, silicon, lanthanum, aluminum, titanium, strontium, or combinations of these materials, such as, for example, hafnium silicate.

When pre-treatments according to embodiments of the present technology are performed, the structure of the metal-containing material can be formed or deposited in an ordered way to produce a more uniform grain structure. This may be produced by forming the reactive ligands of the pre-treatment precursor over a more structured surface material, such as higher quality silicon or silicon oxide as produced by embodiments of the present technology. Additionally, by performing the pre-treatment exposure at certain conditions, additional improvements may be afforded.

The pre-treatment may be performed at a temperature configured to activate the precursor and/or the surface of the substrate. For example, in a situation in which a nitrogen-and-hydrogen-containing precursor may be used as the pre-treatment precursor, the substrate may be maintained at a temperature greater than or about 300° C. while delivering the precursor. Similarly, a pre-treatment with an oxygen-containing precursor may also be performed while maintaining a substrate temperature greater than or about 300° C. For any pre-treatment operation the substrate may also be maintained at a temperature greater than or about 400° C., greater than or about 500° C., greater than or about 600° C., greater than or about 700° C., greater than or about 800° C., or greater. As temperature for the pre-treatment decreases below or about 500° C., the effectiveness may be reduced. Similarly, as temperatures are increased above or about 700° C., nucleation may not be improved, and excess precursor may be incorporated on the surface, which may degrade the mobility of the device. Consequently, in some embodiments the temperature may be maintained between about 500° C. and about 700° C. during the pre-treatment.

Similar temperature ranges may affect operation of one or both of the oxidation operations, which may carefully control both the amount of maintained silicon cap material in the first oxidation, and may limit over oxidation in the second oxidation. To control a slow ingression of oxygen into the silicon material, a temperature may be maintained less than or about 900° C., and may be maintained less than or about 850° C., less than or about 800° C., less than or about 750° C., less than or about 700° C., less than or about 650° C., less than or about 600° C., or less.

Similarly, exposure time may affect the amount of nitrogen-containing precursor incorporation, and thus to limit mobility losses of the produced device, the precursor exposure may be less than or about 3 minutes, and in some embodiments the exposure time may be less than or about 2.5 minutes, less than or about 2 minutes, less than or about 1.5 minutes, less than or about 1 minute, less than or about 45 seconds, less than or about 30 seconds, less than or about 15 seconds, or less. Once an appropriate amount of amine groups have been incorporated, the formation may be performed. The formation, including atomic layer formation may be performed at any temperature, although in some embodiments atomic layer deposition may be performed at a temperature below or about the temperature at which the pre-treatment is performed, regardless of whether the operations are performed in the same or different chambers. For example, the atomic layer deposition may be performed at a second temperature relative to the pre-treatment temperature, and the formation temperature may be less than or about 500° C. in embodiments, and may be less than or about 450° C., less than or about 400° C., less than or about 350° C., less than or about 300° C., less than or about 250° C., or less.

After the layer of high-k material has been formed or deposited, one or more post-treatments may be performed. In some embodiments, the substrate may be transferred from the deposition chamber to another chamber or set of chambers for post-treating the materials. Similar to that explained above, the transfer may occur on a single processing system having multiple chambers, and thus the transfer from or between any of these chambers may be performed while maintaining vacuum conditions. The processing may then include one or more additional post-treatment operations. The post-treatment operations may include one or more operations performed in one or more chambers, including multiple chambers on the same cluster tool. Post-treatment operations may include an oxidation, a nitridation, and/or one or more thermal anneal operations, such as prior to and/or subsequent oxidation or nitridation.

As noted above, the pre-treatment operation may be performed to provide sufficient terminal moieties to afford the uniform growth described previously, while limiting excess precursor from being incorporated with the substrate. For example, an incorporated nitrogen interface may reduce mobility of the produced transistor, or how quickly a carrier can move through the structure. Although the pre-treatment described above may further improve scaling of high-k films, if not controlled, the pre-treatment may actually degrade device mobility. However, in some embodiments, one post-treatment may include oxidizing the formed high-k material with a second oxygen-containing precursor relative to a first oxygen-containing precursor that may be used in the pre-treatment operation.

For example, an oxidation operation utilizing any of the above-noted oxygen-containing precursors may be performed to further oxidize the film after formation. The deposition or formation of the high-k film may produce a porous film, or a film including vacancies in the structure. By performing an oxidation operation, oxygen species may permeate the film filling vacancies, as well as producing an oxide material at the interface of the high-k material, if not formed in previous operations described above. This may improve the underlying interface from the amine terminal groups, which may increase the mobility performance of the device. To limit an excessive increase in an underlying oxide layer thickness, the oxidation operation may be performed for a limited time period, and may be performed within any of the previously noted time ranges.

Post-treatment operations may additionally include further contacting the substrate with a second nitrogen-containing precursor relative to the pre-treatment nitrogen-containing precursor, when used. The second nitrogen-containing precursor may include any nitrogen-containing precursor described above, and may include nitrogen gas, as well as any nitrogen-containing precursor noted elsewhere. The second nitrogen-containing precursor may include a plasma-activated or enhanced nitrogen-containing precursor, a thermally-activated nitrogen, or some other nitrogen precursor, which may allow nitrogen radicals or nitrogen atoms to be incorporated within the high-k structure, which may stabilize the film or settle the film towards an equilibrium state. Unlike an oxidation operation, the nitridation may not increase a thickness of an underlying layer, such as silicon oxide, and may also slightly increase the k-value of the produced film.

Nitrogen incorporation may be controlled to limit the incorporation in the film, in order to maintain the structural and electrical properties. In some embodiments, a post-treatment nitridation may incorporate less than or about 20 atomic % nitrogen at a surface region of the high-k film, and may incorporate less than or about 15 atomic % nitrogen, less than or about 10 atomic % nitrogen, less than or about 8 atomic % nitrogen, less than or about 6 atomic % nitrogen, less than or about 4 atomic % nitrogen, less than or about 2 atomic % nitrogen, or less. In some embodiments, an incorporation between about 3 atomic % and about 7 atomic % may maintain a higher k-value than higher nitrogen incorporation, and may better stabilize the film than lower nitrogen incorporation. By surface region may be meant an exposed surface of the material, although the nitrogen incorporation may extend to any distance within the film, and may be consistent, or form a reducing gradient through the material.

A post-treatment oxidation or nitridation may be performed at any of the temperatures noted previously, although in some embodiments the post-treatment oxidation and/or nitridation may be performed at a temperature range below or about 500° C., and may be performed at a temperature range below or about 400° C., below or about 300° C., below or about 200° C., below or about 100° C., or less depending on the operation being performed.

A post-treatment anneal may be performed subsequent any of the operations, including any of the noted post-treatment operations. The post-treatment anneal may be performed in any chamber in which a previous operation is performed, or may involve transfer to a different chamber, such as one configured to perform a rapid thermal anneal process, for example. Again, the chamber may be incorporated on the same platform as other chambers, which may allow a transfer between chambers while maintaining vacuum conditions. The post-treatment anneal may further align the film bonding and further stabilize the film. In embodiments the post-treatment anneal may be performed at a temperature that may be above deposition or oxidation temperatures in some embodiments. For example, the post-treatment anneal may be performed at a temperature above or about 400° C., and in embodiments may be performed at a temperature above or about 500° C., above or about 600° C., above or about 700° C., above or about 800° C., above or about 900° C., or higher.

By performing a pre-treatment, oxidations, and/or post-treatments according to embodiments of the present technology, improved high-k materials and semiconductor structures may be produced. The layer of high-k material may be produced to any thickness including up to or about several nanometers. However, due to the preferred grain structure produced by the present technology, thinner effective oxide thickness may be produced without loss to gate leakage performance. High-k materials produced according to the present technology may be characterized by k-values greater than or about 10, and may be characterized by k-values greater than or about 15, greater than or about 20, greater than or about 21, greater than or about 22, greater than or about 23, greater than or about 24, greater than or about 25, or greater. By producing films according to embodiments of the present technology, such as incorporating wet processing as described, formed films having a beneficial morphology may be produced, which may enhance the electrical characteristics of the film compared to conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the chamber" includes reference to one or more chambers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An integrated cluster tool comprising:
a factory interface including a first transfer robot;
a wet clean system coupled with the factory interface at a first side of the wet clean system;
a load lock chamber coupled with the wet clean system at a second side of the wet clean system opposite the first side of the wet clean system;
a first transfer chamber coupled with the load lock chamber, wherein the first transfer chamber includes a second transfer robot;
a thermal treatment chamber coupled with the first transfer chamber;
a second transfer chamber coupled with the first transfer chamber, wherein the second transfer chamber includes a third transfer robot;
a metal deposition chamber coupled with the second transfer chamber; and
a controller configured to perform:
processing a substrate in a wet clean chamber of the wet clean system to remove residual organics and particles from a surface of an oxide formed on the substrate, wherein the substrate comprises a silicon layer, and wherein processing the substrate in the wet clean chamber maintains an amount of moisture on the surface of the oxide until gate formation processing; and
performing the gate formation processing on the substrate directly after processing the substrate in the wet clean chamber, and performing the gate formation processing comprises forming a high-k dielectric material on the surface of the oxide.

2. The integrated cluster tool of claim 1, further comprising:
a dry etch chamber accessible to the first transfer chamber or the second transfer chamber.

3. The integrated cluster tool of claim 1, wherein the wet clean chamber comprises:
a single-wafer wet clean chamber operably maintained at atmospheric pressure, wherein the first transfer chamber is maintained at vacuum conditions.

4. The integrated cluster tool of claim 3, wherein the single-wafer wet clean chamber is fluidly coupled with multiple chemistry delivery systems.

5. The integrated cluster tool of claim 3, wherein the single-wafer wet clean chamber is accessible to the first transfer robot of the factory interface.

6. The integrated cluster tool of claim 3, wherein the wet clean system further comprises:
a fourth transfer robot disposed in the wet clean system, wherein the fourth transfer robot is operable to transfer substrates between the single-wafer wet clean chamber and the load lock chamber.

7. The integrated cluster tool of claim 3, wherein the wet clean system further comprises:
a plurality of single-wafer wet clean chambers stacked on one another.

8. The integrated cluster tool of claim 7, wherein each single-wafer wet clean chamber is fluidly coupled with multiple chemistry delivery systems.

9. The integrated cluster tool of claim 1, wherein a track on which the first transfer robot operates extends into the wet clean system.

10. The integrated cluster tool of claim 1:
wherein the controller is further configured to cause the integrated cluster tool to:
deliver the substrate from the factory interface to the wet clean system;
process the substrate in a wet clean chamber of the wet clean system to remove oxide from a surface of the substrate, wherein the substrate comprises a silicon layer;
deliver the substrate from the wet clean system to the load lock chamber;
deliver the substrate from the load lock chamber to the metal deposition chamber;
form a high-k dielectric material;
treat the high-k dielectric material with a nitrogen-containing precursor; and
anneal the high-k dielectric material.

11. The integrated cluster tool of claim 10, wherein:
the controller is further configured to cause the integrated cluster tool to, prior to forming the high-k dielectric material, oxidize at least a portion of the silicon layer, forming the oxide.

12. The integrated cluster tool of claim 11, wherein:
the controller is further configured to cause the integrated cluster tool to, subsequent to oxidizing at least a portion of the silicon layer, perform the wet clean chamber processing with a solution of ammonium hydroxide and hydrogen peroxide.

13. The integrated cluster tool of claim 10, wherein:
the controller is further configured to cause the integrated cluster tool to, prior to treating the high-k dielectric material with a nitrogen-containing precursor, anneal the high-k dielectric material.

14. The integrated cluster tool of claim 10, wherein processing the substrate in the wet clean chamber comprises:
cleaning the substrate with a first chemistry including hydrofluoric acid;
cleaning the substrate with a second chemistry comprising ammonium hydroxide; and
cleaning the substrate with a third chemistry comprising hydrochloric acid.

15. The integrated cluster tool of claim 14, wherein:
the controller is further configured to cause the integrated cluster tool to clean the substrate with a fourth chemistry comprising ozone-infused deionized water.

16. An integrated cluster tool comprising:
a factory interface including a first transfer robot, wherein the factory interface comprises one or more access locations for front-opening unified pods on a first surface of the factory interface;
a wet clean system coupled at a first side of the wet clean system with a second surface of the factory interface opposite the first surface of the factory interface;
a load lock chamber coupled with the wet clean system at a second side of the wet clean system opposite the first side of the wet clean system;
a transfer chamber coupled with the load lock chamber, wherein the transfer chamber includes a second transfer robot;
a metal deposition chamber coupled with the transfer chamber; and

a controller configured to perform:
  processing a substrate in a wet clean chamber of the wet clean system to remove residual organics and particles from a surface of an oxide formed on the substrate, wherein the substrate comprises a silicon layer, and wherein processing the substrate in the wet clean chamber maintains an amount of moisture on the surface of the oxide until gate formation processing; and
  performing the gate formation processing on the substrate directly after processing the substrate in the wet clean chamber, wherein performing the gate formation processing comprises forming a high-k dielectric material on the surface of the oxide.

17. The integrated cluster tool of claim 16, wherein the transfer chamber is a second transfer chamber, the integrated cluster tool further comprising:
  a first transfer chamber coupled between the load lock chamber and the second transfer chamber.

18. The integrated cluster tool of claim 17, further comprising:
  a dry etch chamber coupled with the first transfer chamber.

19. The integrated cluster tool of claim 16, wherein the wet clean chamber comprises:
  a single-wafer wet clean chamber operably maintained at atmospheric pressure, wherein the transfer chamber is maintained at vacuum conditions.

20. The integrated cluster tool of claim 19, wherein the single-wafer wet clean chamber is accessible to the first transfer robot of the factory interface.

21. The integrated cluster tool of claim 19, wherein the wet clean system further comprises:
  a fourth transfer robot disposed in the wet clean system, wherein the fourth transfer robot is operable to transfer substrates between the single-wafer wet clean chamber and the load lock chamber.

22. The integrated cluster tool of claim 19, wherein the wet clean system further comprises:
  two or more vertically stacked, single-wafer wet clean chambers.

23. The integrated cluster tool of claim 22, wherein each single-wafer wet clean chamber is fluidly coupled with a different chemistry delivery system.

* * * * *